United States Patent
Lee et al.

(10) Patent No.: US 6,951,135 B2
(45) Date of Patent: Oct. 4, 2005

(54) ULTRASONIC PROBE AND METHOD FOR THE FABRICATION THEREOF

(75) Inventors: Sang-Goo Lee, Siheung-si (KR); Sung-Min Rhim, Seongnam-si (KR); Ho Jung, Seoul (KR); Sea-Hoon Kim, Seoul (KR)

(73) Assignees: Ibule Photonics Inc. (KR); Ibule Humanscan Co., Ltd. (KR)

( * ) Notice: Subject to any disclaimer, the term of this patent is extended or adjusted under 35 U.S.C. 154(b) by 0 days.

(21) Appl. No.: 10/845,928

(22) Filed: May 14, 2004

(65) Prior Publication Data

US 2004/0206183 A1 Oct. 21, 2004

Related U.S. Application Data

(63) Continuation-in-part of application No. PCT/KR02/02126, filed on Nov. 14, 2002, now abandoned.

(51) Int. Cl.[7] .......................... G01N 9/18; H04R 17/00; A61B 8/14
(52) U.S. Cl. .................. 73/661; 73/632; 29/25.35; 600/459
(58) Field of Search .................. 73/661, 628, 632; 29/25.35; 600/459; 310/368

(56) References Cited

U.S. PATENT DOCUMENTS

| | | | | |
|---|---|---|---|---|
| 5,042,493 A | * | 8/1991 | Saito et al. | 600/459 |
| 5,410,209 A | * | 4/1995 | Yamashita et al. | 310/334 |
| 6,238,481 B1 | * | 5/2001 | Yamashita et al. | 117/84 |
| 6,362,558 B1 | * | 3/2002 | Fukui | 310/358 |
| 6,806,625 B2 | * | 10/2004 | Ogawa et al. | 310/358 |
| 6,844,661 B2 | * | 1/2005 | Mizuno | 310/358 |

* cited by examiner

*Primary Examiner*—Hezron Williams
*Assistant Examiner*—Jacques M. Saint-Surin
(74) *Attorney, Agent, or Firm*—Anderson Kill & Olick, PC

(57) ABSTRACT

An ultrasonic probe comprising a piezoelectric element, a first electrode formed on a substantial portion of a first main face, a first side face and a part of a second main face of the piezoelectric element, and a second electrode formed on a substantial portion of a second main face, a second side face and a part of a first main face of the piezoelectric element, the two electrodes being isolated from each other by two grooves formed on the first and second main faces of the piezoelectric element, in a manner parallel to the side edges of the piezoelectric element, respectively, has good vibration and probing properties.

10 Claims, 10 Drawing Sheets

ULTRASONIC PROBE AND METHOD FOR THE FABRICATION THEREOF

CROSS REFERENCE TO RELATED APPLICATION

This application is a continuation-in-part application of International Application No. PCT/KR2002/02126 filed on Nov. 14, 2002 while designating the United States of America, now abandoned.

FIELD OF THE INVENTION

The present invention relates to an ultrasonic probe having uniquely designed electrodes, and a method for the fabrication thereof.

BACKGROUND OF THE INVENTION

Ultrasonic imaging equipments have been widely used, and they conventionally comprise an ultrasonic probe for transducing an ultrasonic wave to an electric signal, a processing unit for processing the electric signal to an image and a display unit for displaying the image. The ultrasonic probe plays an important role in obtaining high-resolution image, and it is required to have a high electromechanical coupling coefficient, as well as good ultrasonic wave pulse and focusing characteristics of ultrasonic beam.

An ultrasonic probe typically comprises an ultrasonic transmitting/receiving element consisting essentially of a piezoelectric element having a pair of electrodes, and as the piezoelectric element, lead zirconate titanate-based ceramics (PZT) was previously employed, but recently, a lead zirconia niobate-lead titanate ($Pb(Zn_{1/3}Nb_{2/3})O_3$-$PbTiO_3$; "PZN-PT")- or lead magnesium niobate-lead titanate ($Pb(Mg_{1/3}Nb_{2/3})O_3$-$PbTiO_3$; "PMN-PT")-based piezoelectric single crystals have become favored because of their better properties. However, PZN-PT and PMN-PT have the disadvantage of poor thermal stability due to a low phase transition temperature. For example, while PZT has a phase transition temperature range of about 200 to 385° C., 0.67 PMN-0.33 PT exhibits the phase transition phenomena at about 150° C. If a piezoelectric element is subjected to a temperature higher than the phase transition temperature, it will become depolarized, and thus, the preparing process of an ultrasonic probe using such piezoelectric elements should not involve a high-temperature step.

Accordingly, the electrical connection in an ultrasonic probe has been often achieved by using an epoxy paste which does not require a high temperature, rather than by soldering. However, the insertion of an epoxy paste layer tends to degrade the performance of the ultrasonic probe, and the connection of a flexible printed circuit board (FPCB) thereto requires an elaborate fabrication procedure. Although a silver epoxy paste having a better conductivity than a non-silver epoxy paste has been used in an attempt to reduce the thickness of the epoxy paste layer, the above-mentioned low performance problem remains unresolved.

SUMMARY OF THE INVENTION

It is, therefore, a primary object of the invention to provide a novel ultrasonic probe comprising a piezoelectric element having uniquely designed electrodes and FPCB attached thereto in a way which is not influenced by the paste used for the attachment.

In accordance with an aspect of the present invention, there is provided an ultrasonic probe comprising:
a piezoelectric element consisting essentially of a piezoelectric single crystal and having a first and second main faces and a first and second side faces;
a first electrode deposited on a substantial portion of the first main face, the first side face, and a part of the second main face of the piezoelectric element, and a second electrode deposited on a substantial portion of the second main face, the second side face, and a part of the first main face of the piezoelectric element, the first and second electrodes being isolated from each other by two grooves formed on the first and second main faces of the piezoelectric element, in a manner parallel to the side edges of the piezoelectric element, respectively, at positions separated from the second and first side edges by a given distance, respectively;
a backing layer attached to the electrode layer deposited on the second main face of the piezoelectric element;
a ground electrode attached to the first electrode at the first side face of the piezoelectric element; and
a flexible printed circuit board attached to the second electrode in the front of the groove positioned on the first main face, extending from the second side face, of the piezoelectric element, by the end part bended at a right angle.

In accordance with another aspect of the present invention, there is provided a method of the fabrication of an ultrasonic probe comprising:
depositing an electrode layer on a first and second main faces and a first and second side faces of a piezoelectric element;
forming two grooves on the first and second main face of the piezoelectric element, in a manner parallel to the side edges of the piezoelectric element, respectively, at positions separated from the second and first side edges of the piezoelectric element by a given distance, respectively, to separate the electrode layer into two electrodes;
attaching a backing layer to the electrode layer deposited on the second main face of the piezoelectric element;
attaching a ground electrode to the first electrode at the side face of piezoelectric element; and
attaching a flexible printed circuit board to the second electrode in the front of the groove positioned on the first main face, extending from the second side face, of the piezoelectric element, by the end part bended at a right angle.

BRIEF DESCRIPTION OF THE DRAWINGS

The above and other objects and features of the present invention will become apparent from the following description thereof, when taken in conjunction with the accompanying drawings which respectively shows.

DETAILED DESCRIPTION OF THE INVENTION

The inventive ultrasonic probe is characterized by comprising uniquely designed electrodes and FPCB attached thereto in a form not influenced by the paste used for the attachment.

An ultrasonic probe conventionally contains a piezoelectric device (an ultrasonic transmitting/receiving element) comprising a piezoelectric element consisting essentially of a piezoelectric single crystal; a first and second electrodes formed on an ultrasonic wave transmitting/receiving face and the face opposite to the transmitting/receiving face of the piezoelectric element, respectively; acoustic matching layers formed on the first electrode; an acoustic lens formed to cover the entire surface of the acoustic matching layer; a ground electrode connected to the first electrode; and a flexible printed circuit board for signal, connected to the second electrode.

The inventive ultrasonic probe is characterized in that the first electrode is formed on a substantial portion of a first main face, a first side face and a part of a second main face of the piezoelectric element, and the second electrode is formed on a substantial portion of a second main face, a second side face and a part of a first main face of the piezoelectric element, and that the two electrodes are isolated from each other by two grooves formed on the first and second main faces of the piezoelectric element, in a manner parallel to the side edges of the piezoelectric element, respectively, at positions separated from the second and first side edges by a given distance, respectively.

Figure 2A:
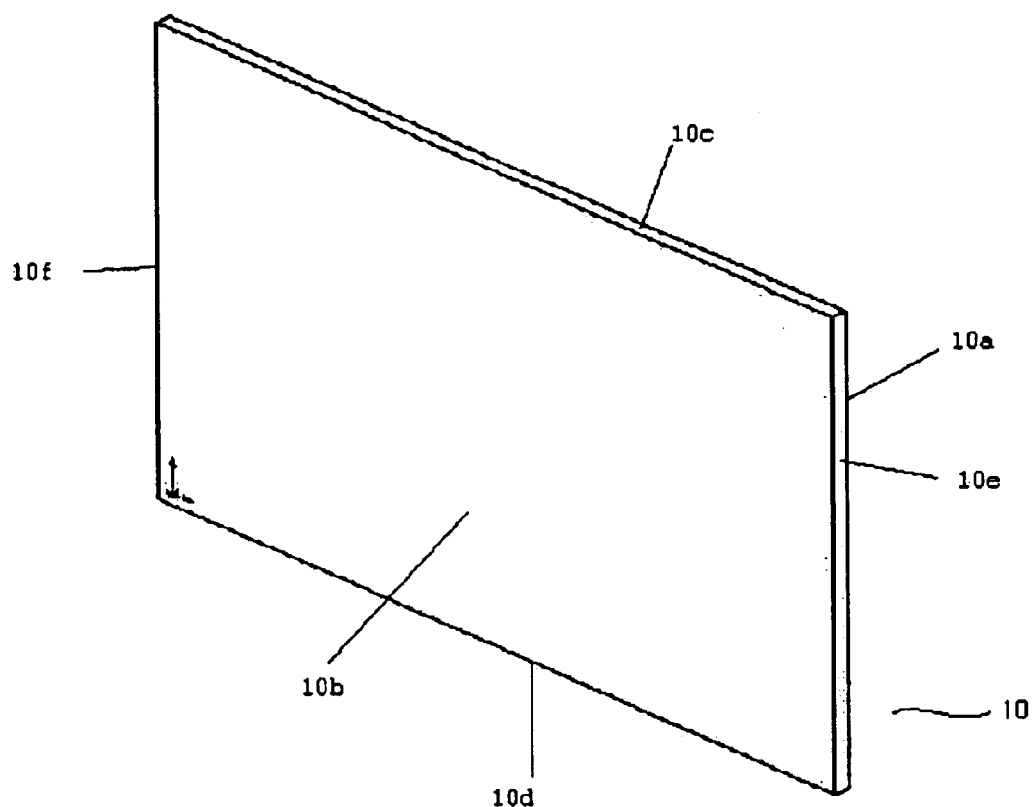
FIGS. 2a to 2c: the procedures for forming two electrodes on a piezoelectric element in accordance with the present invention.
Figure 2B:
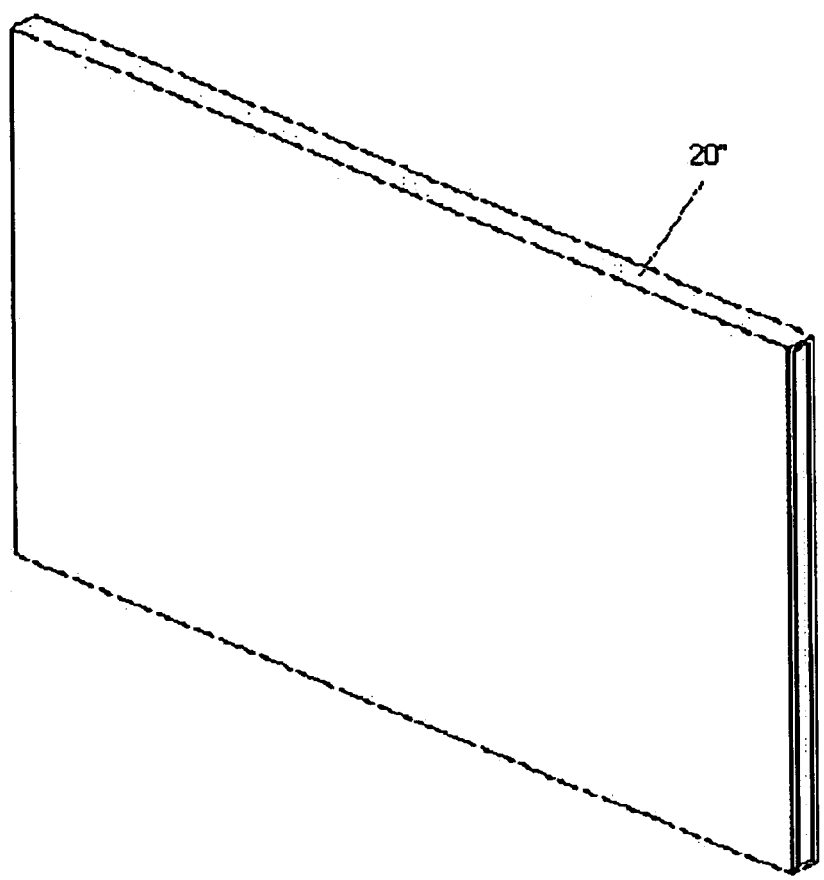

The inventive ultrasonic probe may be fabricated as shown in FIGS. 2 and 3. Specifically, electrode layer 20" is deposited on the first and second main faces 10a, 10b and the first and second side faces 10c, 10d of single crystal piezoelectric element or wafer 10 (see FIG. 2a), to obtain a coated wafer (see FIG. 2b).

The piezoelectric element may have a thickness of 20 to 500,000 μm, preferably 50 to 400 μm, in the direction of vibration.

The electrode layer may be made of a conductive metal such as Cr, Cu, Ni, Au, etc., and a combination thereof. The deposition of the electrode layer may be conducted using a sputtering, electronic-beam, thermal-evaporation or electroplating method, and the thickness of the deposited electrode may range from 100 to 10,000 Å.

Figure 2C:
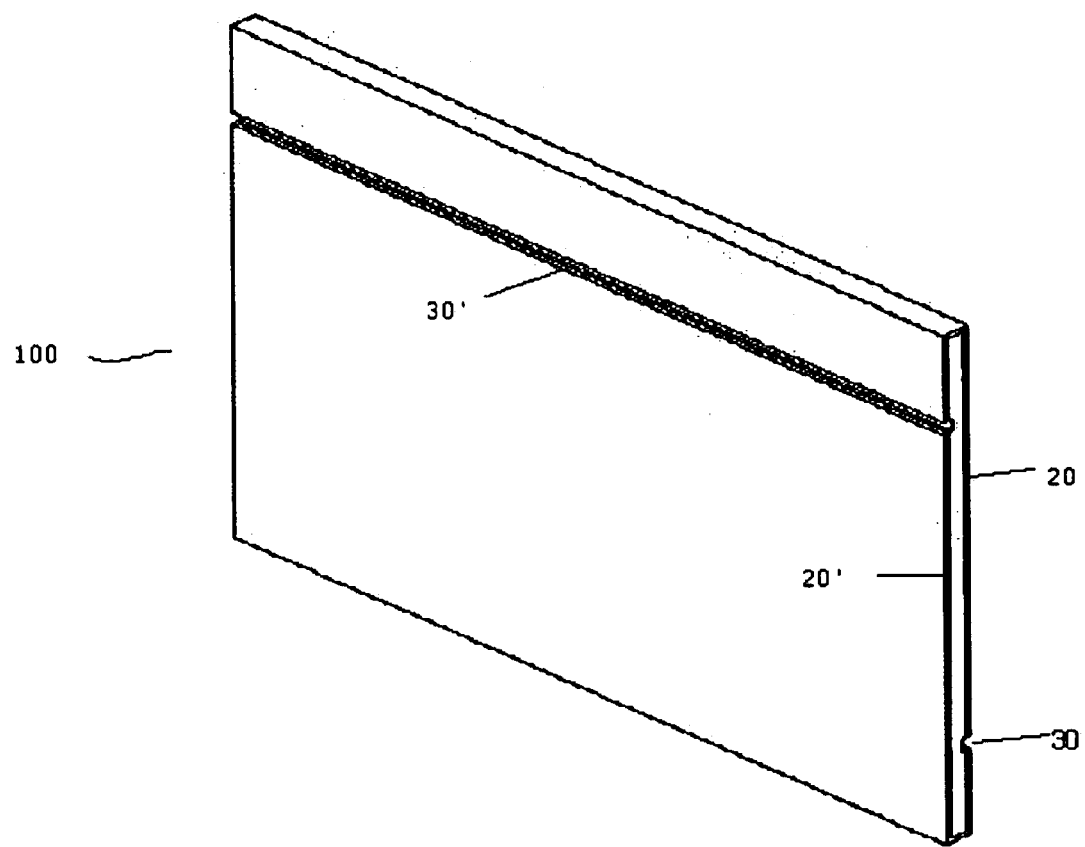

Then, two grooves 30, 30' are formed to separate electrode layer 20" into first electrode 20 formed mainly on first main face 10a and first side face 10c (an ultrasonic wave transmitting/receiving face), and second electrode 20' formed mainly on second main face 10b and second side face 10d (the face opposite to the transmitting/receiving face), as shown in FIG. 2c.

The grooves 30, 30' may each be formed at a position separated from the side edge of the piezoelectric element by a given distance, for example a distance to make room for applying an epoxy paste to attach the electrode to a flexible printed circuit board or a ground electrode in a later step, using a dicing saw. Preferably, the grooves may be formed at the position of 1 to 1.5 mm inwardly from each side edge, and to a depth corresponding to 70 to 80% of the wafer thickness, in order to inhibit the generation of undesirable vibration.

The resulting assembly 100 is then used to fabricate the inventive ultrasonic probe, as shown in FIGS. 3a to 3d.

Figure 3A:
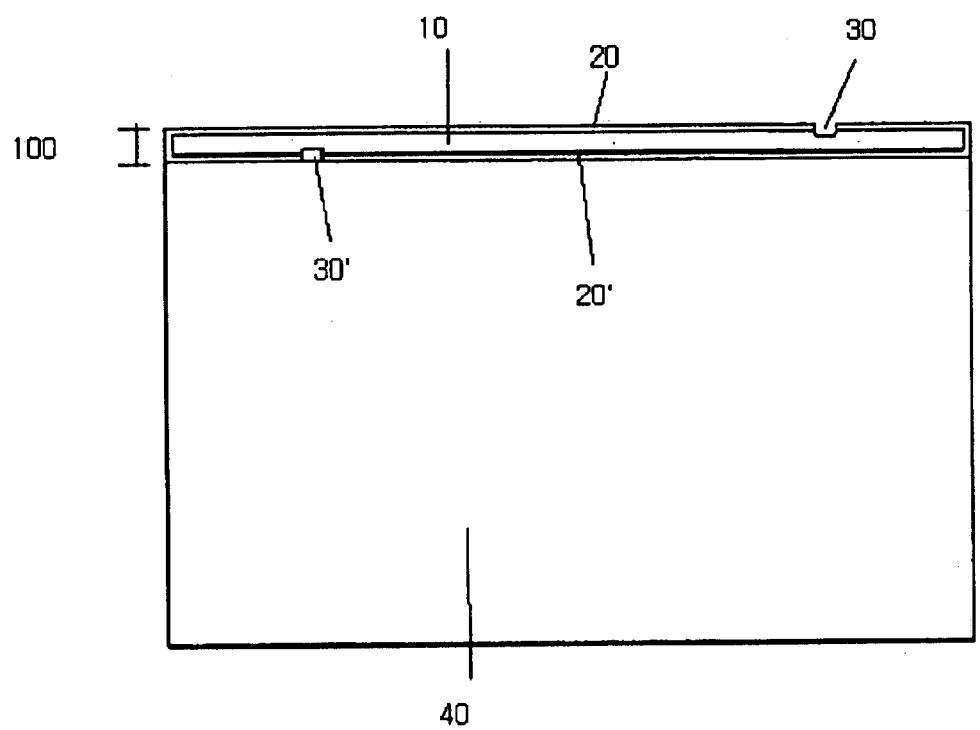
FIGS. 3a to 3d: the procedure for fabricating the inventive ultrasonic probe using the assembly of FIG. 2c, in accordance with the present invention.
Figure 3B:
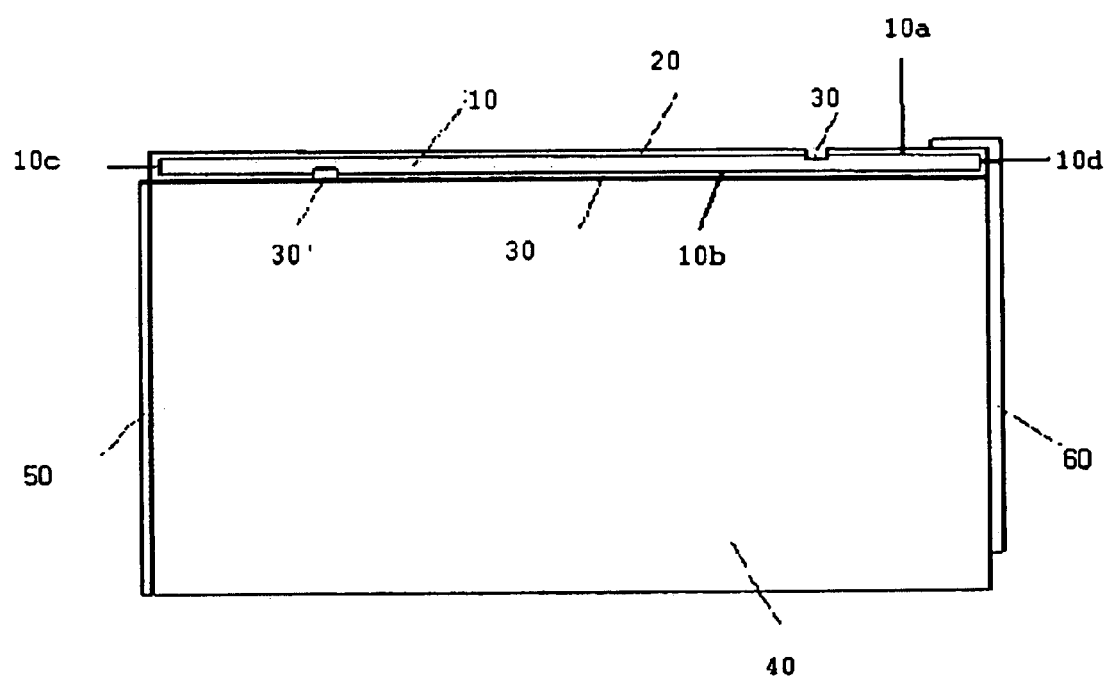

FIG. 3a shows the step of attaching backing layer 40 to the electrode layer deposited on second main face 10b of the piezoelectric element, using an epoxy paste in a conventional manner, and FIG. 3b shows the step of attaching ground electrode plate 50 and flexible printed circuit board 60 for signal.

In accordance with the present invention, as represented in FIG. 3b, ground electrode plate 50 is attached to first electrode 20 at first side face 10c of piezoelectric element 10, and flexible printed circuit board 60 is attached to second electrode 20' in the front portion of the groove 30 positioned on first main face 10a of the piezoelectric element, extending from second side face 10d of the piezoelectric element, and bending at the end part at a right angle.

Figure 3C:
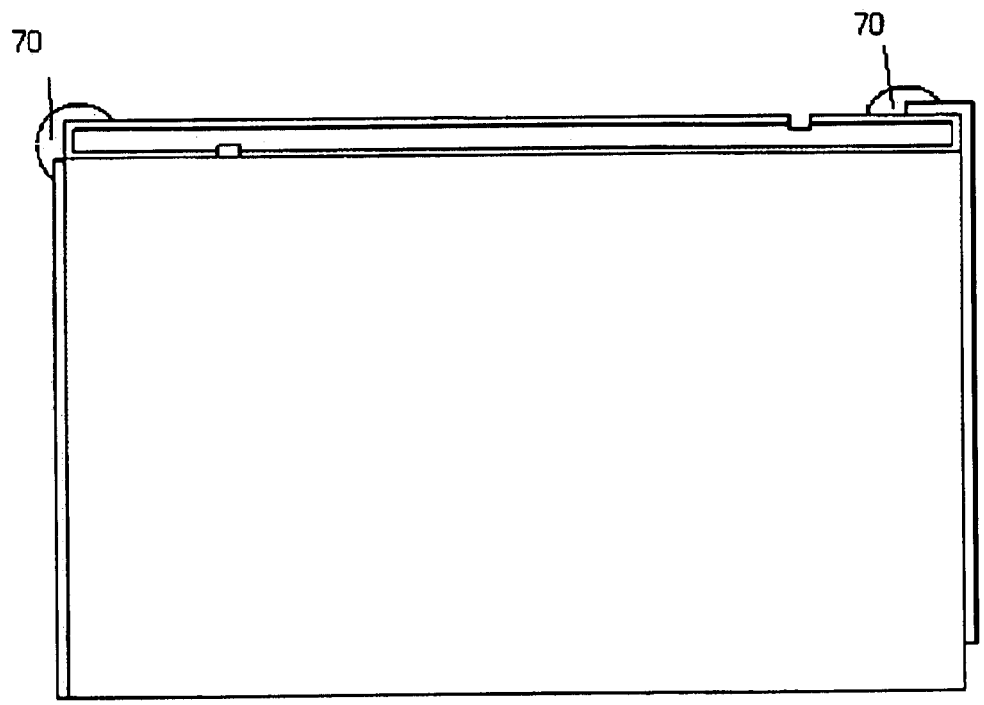

The attachment of the ground electrode plate and the flexible printed circuit board to the first and second electrodes, respectively, may be conventionally carried out using conductive epoxy paste 70, preferably a conductive silver epoxy paste, as shown in FIG. 3c, and the use of such bended end part make the bonding of the electrode with the flexible printed circuit board strong.

Figure 3D:
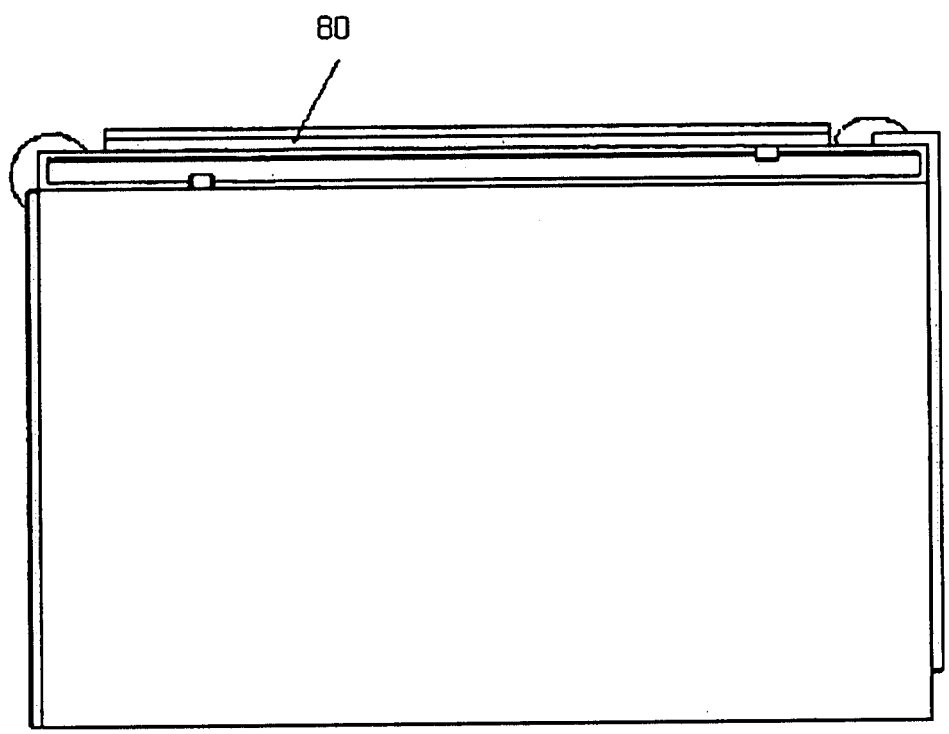

Subsequently, at least one acoustic matching layer 80 may be formed on the electrode layer deposited on the first main face of the piezoelectric element, as in FIG. 3d, and thereon an acoustic lens may be covered.

Figure 1:
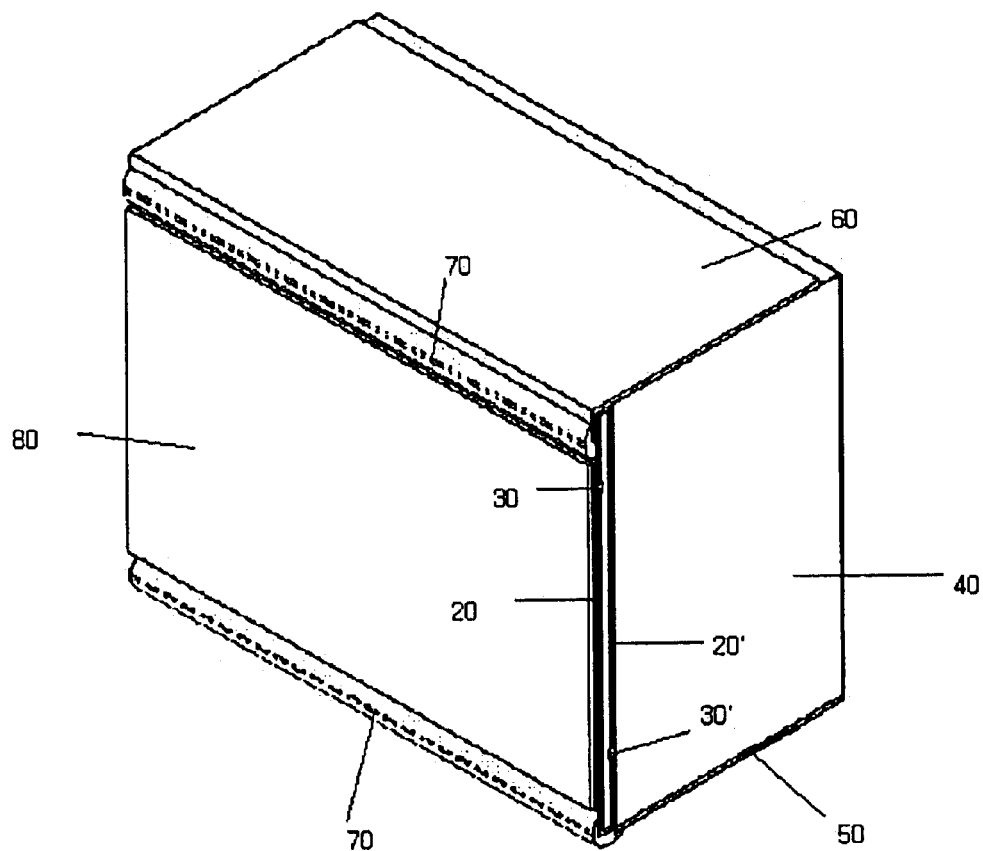
FIG. 1: a schematic view of an ultrasonic probe according to the present invention.

The ultrasonic probe fabricated by the inventive method, as shown in FIG. 1, can have excellent vibration characteristics, a wide frequency band, and a high sensitivity.

The piezoelectric single crystal used in the ultrasonic probe may be any strongly ferroelectric, homogeneous single crystal, preferably PMN-PT, of which an example may have the composition of formula (I):

x(A)y(B)z(C)–p(P)n(N)                                    (I)

wherein,
(A) is $Pb(Mg_{1/3}Nb_{2/3})O_3$ or $Pb(Zn_{1/3}Nb_{2/3})O_3$,
(B) is $PbTiO_3$,
(C) is $LiTaO_3$,
(P) is a metal selected from the group consisting of Pt, Au, Ag, Pd and Rh,
(N) is an oxide of a metal selected from the group consisting of Ni, Co, Fe, Sr, Sc, RU, Cu and Cd,
x is a number in the range of 0.65 to 0.98,
y is a number in the range of 0.01 to 0.34,
z is a number in the range of 0.01 to 0.1,
p is a number in the range of 0.01 to 5, and
n is a number in the range of 0.01 to 5.

The single crystal of formula (I) may be prepared by way of conducting a solid phase reaction followed by melting-crystallization, by a method described in Korean Patent No. 392754.

The piezoelectric single crystal of formula (I) has a high dielectric constant of about 5,500 or higher, a piezoelectric constant of about 1,500 pC/N or higher at an ambient temperature, and a low temperature coefficient in a broad temperature range of −20 to 90° C.

The inventive ultrasonic probe has a relative dielectric constant ranging from about 1,000 to 10,000, the velocity of a sound wave generated on the (001) face ranging from 1,200 to 4,000 m/s (frequency constant: 1,400 to 2,000 HZ.m), and a high electromechanical coefficient ($k_{33}'$) ranging from 80 to 95%. Accordingly, the inventive ultrasonic probe can be beneficially used for an ultrasonic diagnosis in medical, military, and industrial fields.

The following Examples are given for the purpose of illustration only and are not intended to limit the scope of the invention.

EXAMPLE

An ultrasonic probe as shown in FIG. 1, according to the present invention, was fabricated by a method comprising the procedures as shown in FIGS. 2 and 3.

Piezoelectric single crystal substrate 10 having a (001) face (surface 10a) and a size of 20–25 mm×15–20 mm×0.4–0.5 mm was prepared, and metal layer (Cr/Cu/Au) 20" was deposited using a DC sputtering method on surfaces 10a, 10b, 10c and 10d of the substrate (but not on surfaces 10e and 10f) at an ambient temperature under a pressure of 1.2×10$^{-7}$ mmHg (FIGS. 2a and 2b).

Subsequently, two grooves 30 and 30' were formed on surfaces 10a and 10b of the metal deposited piezoelectric single crystal substrate, respectively, to separate metal layer 20" into two electrodes 20 and 20' by using a dicing saw: Groove 30 was formed on electrode layer 20" deposited on surface 10a in a manner parallel to the edge formed with surface 10d at a distance of 1–1.5 mm from said edge, while groove 30' was formed on electrode layer 20" deposited on surface 10b at a distance of 1–1.5 mm from the side edge with surface 10c of the substrate (FIG. 2c). Each of two grooves 30, 30' had a depth of 0.25–0.35 mm.

Backing layer 40 was laminated on the electrode layer deposited on surface 10b of piezoelectric substrate 10 using an epoxy paste (FIG. 3a), and ground electrode plate 50 was attached to electrode 20 at first side face 10c of piezoelectric substrate 10 while flexible printed circuit board 60 was attached to electrode 20' at a part of the front of groove 30, beyond second side face 10d, of piezoelectric substrate 10, by bending at a right angle (FIG. 3b). Thereafter, two acoustic matching layers 80 were laminated on the electrode layer deposited on surface 10a of piezoelectric substrate 10, and thereon an acoustic lens was covered to fabricate the inventive ultrasonic probe, as shown in FIG. 1.

COMPARATIVE EXAMPLE

The procedures of the Example were repeated except that the two electrodes 20, 20' were formed by coating an electrode material after a masking tape was covered on the isolation portions 30, 30' and then removing the masking tape after coating, to fabricate an ultrasonic probe.

Vibration Characteristics

Figure 4A:
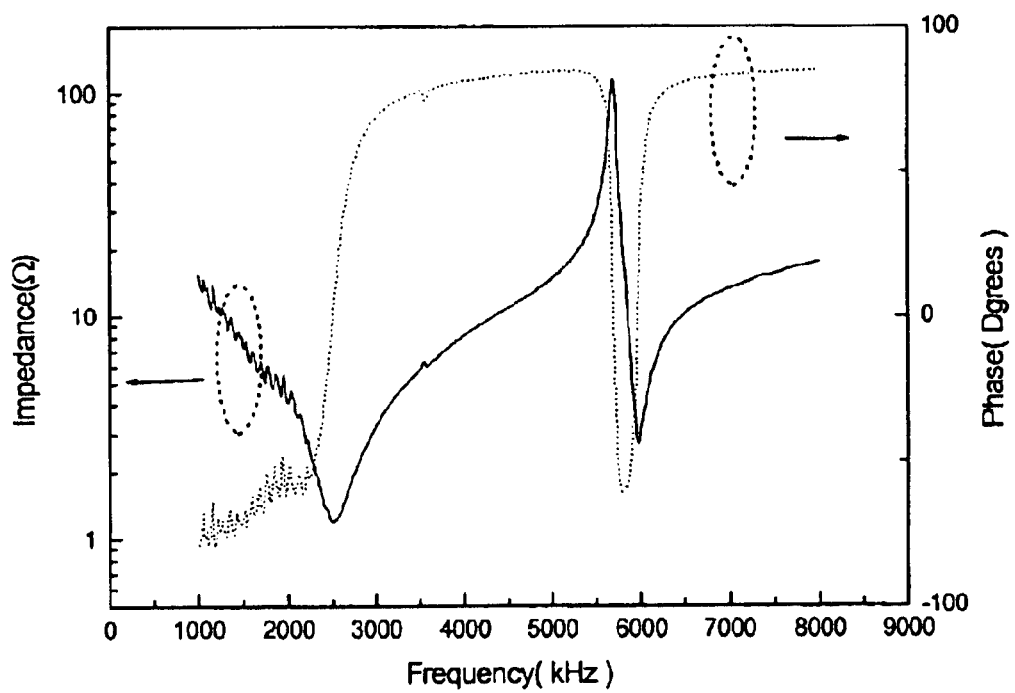
FIG. 4a: the vibration characteristic of a piezoelectric element having the electrodes formed according to Example of the present invention.
Figure 4B:
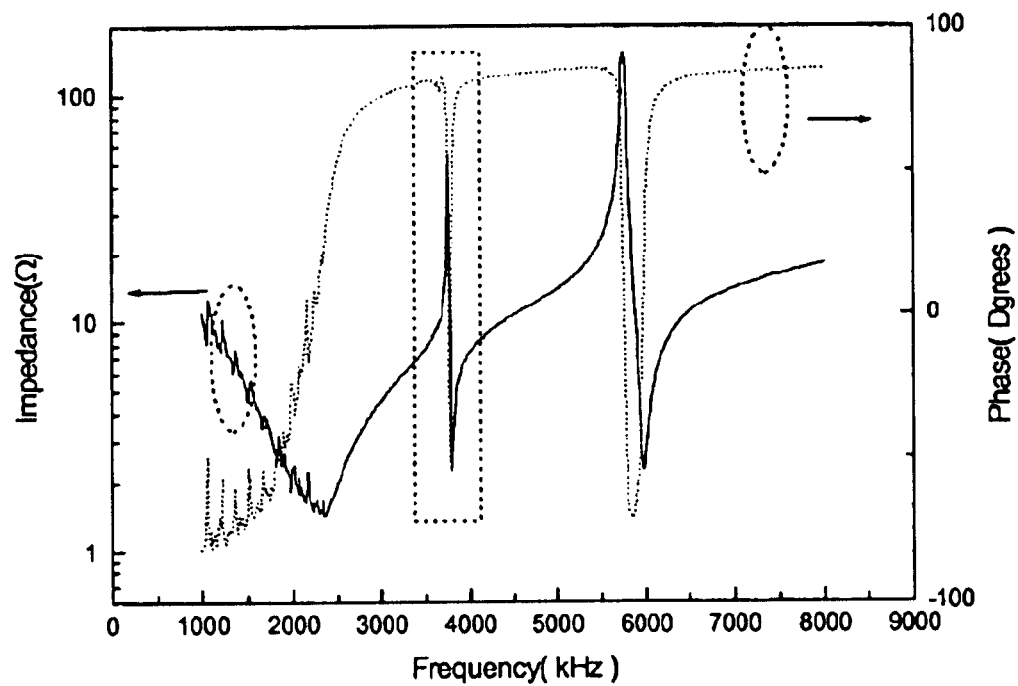
FIG. 4b: the vibration characteristic of a piezoelectric element having the electrodes formed in comparative Example.

The vibration characteristic of the piezoelectric elements on which the electrodes were deposited according to Example and Comparative Example were tested and the results are represented in FIG. 4a and FIG. 4b, respectively.

From FIG. 4b, it can be seen that the piezoelectric element according to Comparative Example generates an undesirable vibration as shown in a dot-line box. In contrast, FIG. 4a shows that such undesirable vibration did not appear in the piezoelectric element according to the present invention. Accordingly, the inventive probe comprising electrodes isolated by grooves having a given depth gives improved vibration performance.

Probing Characteristics

The probing characteristics (the relative sensitivity and the band-width) of the ultrasonic probes fabricated in Example and Comparative Example were measured with a pulse-echo response test, and the results are shown in Table 1:

TABLE 1

|  | Probe of Example | Probe of Comparative Example |
|---|---|---|
| Relative sensitivity (dB) | 1.5 | 0 |
| –6 dB Band width (%) | 101.9 | 85.1 |

Table 1 shows that the inventive probe having electrode isolation grooves is better in terms of sensitivity and band-width than the probe of Comparative Example having a simple isolation portion.

While the invention has been described in connection with the above specific embodiments, it should be recognized that various modifications and changes may be made to the invention by those skilled in the art without departing from the scope of the invention as defined by the appended claims.

What is claimed is:

1. An ultrasonic probe comprising:

(A) a piezoelectric element consisting essentially of a piezoelectric single crystal and having a first and second main faces and a first and second side faces;

(B) a first electrode deposited on a substantial portion of the first main face, the first side face, and a part of the second main face of the piezoelectric element, and a second electrode deposited on a substantial portion of the second main face, the second side face, and a part of the first main face of the piezoelectric element, the first and second electrodes being isolated from each other by two grooves formed on the first and second main faces of the piezoelectric element, in a manner parallel to the side edges of the piezoelectric element, respectively, at positions separated from the second and first side edges by a given distance, respectively;

(C) a backing layer attached to the electrode layer deposited on the second main face of the piezoelectric element;

(D) a ground electrode attached to the first electrode at the first side face of the piezoelectric element; and (E) a flexible printed circuit board attached to the second electrode in the front of the groove positioned on the first main face, extending from the second side face, of the piezoelectric element, by the end part bended at a right angle.

2. The ultrasonic probe of claim 1, wherein the grooves are positioned at a distance to make room for applying an epoxy paste to attach the electrodes to a flexible printed circuit board or a ground electrode, inwardly from respective side edges of the piezoelectric element.

3. The ultrasonic probe of claim 2, wherein the two grooves are positioned at 1–1.5 mm inwardly from respective side edges of the piezoelectric element.

4. The ultrasonic probe of claim 1, wherein the two grooves have a depth corresponding to 70 to 80% of the total piezoelectric element thickness.

5. A method for fabricating an ultrasonic probe using a piezoelectric element having a plurality of main faces, a plurality of side faces and a plurality of side edges comprising:

(A) depositing an electrode layer on a first and second main face and on a first and second side face of said piezoelectric element;

(B) forming two grooves on the first and second main face of the piezoelectric element, in a manner parallel to the side edges of the piezoelectric element, respectively, at positions separated from the second and first side edges of the piezoelectric element by a given distance, respectively, to separate the electrode layer into two electrodes;

(C) attaching a backing layer to the electrode layer deposited on the second main face of the piezoelectric element;

(D) attaching a ground electrode to the first electrode at the side face of piezoelectric element; and (E) attaching a flexible printed circuit board to the second electrode in the front of the groove positioned on the first main face, extending from the second side face, of the piezoelectric element, by the end part bended at a right angle.

6. The method of claim 5, wherein the two grooves are formed at a distance to make room for applying an epoxy paste to attach the electrodes to a flexible printed circuit board or a ground electrode, inwardly from respective side edges of the piezoelectric element.

7. The method of claim 6, wherein the two grooves are formed at a position of 1–1.5 mm inwardly from respective side edges of the piezoelectric element.

8. The method of claim 6, wherein the epoxy paste is a silver epoxy paste.

9. The method of claim 5, wherein the two grooves are formed to have a depth corresponding to 70 to 80% of the total piezoelectric element thickness.

10. The method of claim 5, wherein the two grooves are formed using a dicing saw.

* * * * *